United States Patent
Kasahara

(10) Patent No.: US 11,735,431 B2
(45) Date of Patent: Aug. 22, 2023

(54) PATTERN FORMATION METHOD AND SEMICONDUCTOR DEVICE MANUFACTURING METHOD

(71) Applicant: Kioxia Corporation, Tokyo (JP)

(72) Inventor: Yusuke Kasahara, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 177 days.

(21) Appl. No.: 17/010,989

(22) Filed: Sep. 3, 2020

(65) Prior Publication Data
US 2021/0280431 A1  Sep. 9, 2021

(30) Foreign Application Priority Data
Mar. 4, 2020  (JP) .................. 2020-036677

(51) Int. Cl.
*H01L 21/311* (2006.01)
*H01L 21/02* (2006.01)
*H10B 43/27* (2023.01)

(52) U.S. Cl.
CPC .. *H01L 21/31144* (2013.01); *H01L 21/02118* (2013.01); *H01L 21/02271* (2013.01); *H01L 21/02282* (2013.01); *H01L 21/31111* (2013.01); *H01L 21/31138* (2013.01); *H10B 43/27* (2023.02)

(58) Field of Classification Search
CPC ........... H01L 21/31144; H01L 21/2118; H01L 21/02271; H01L 21/02282; H01L 21/31111; H01L 21/31138; H01L 21/0332; H01L 21/31058; H01L 21/31116; H01L 27/11582
See application file for complete search history.

(56) References Cited

U.S. PATENT DOCUMENTS

| | | | | |
|---|---|---|---|---|
| 6,140,200 | A | * | 10/2000 | Eldridge ............. B81C 1/00047 257/E21.256 |
| 6,531,755 | B1 | * | 3/2003 | Usami ............... H01L 21/76802 257/E21.252 |
| 7,226,853 | B2 | * | 6/2007 | Bekiaris .............. H01L 21/0332 257/E21.27 |
| 9,058,983 | B2 | * | 6/2015 | Dubois ............... H01L 21/0234 |
| 10,157,750 | B2 | | 12/2018 | Terakura et al. |
| 2013/0122712 | A1 | * | 5/2013 | Kim .................. H01L 21/31116 438/714 |
| 2019/0080900 | A1 | | 3/2019 | Kasahara |
| 2019/0218321 | A1 | | 7/2019 | Yamamoto et al. |

FOREIGN PATENT DOCUMENTS

EP          799497 B1 *  1/2000  ....... H01L 23/53228

* cited by examiner

*Primary Examiner* — Dale E Page
*Assistant Examiner* — Quovaunda Jefferson
(74) *Attorney, Agent, or Firm* — Foley & Lardner LLP

(57) ABSTRACT

In a pattern formation method, a first organic film is formed on a film to be etched and contains a metal. A second organic film is formed on the first organic film, and has a higher density than a density of the first organic film. The first and second organic films are patterned to form a mask, and the film to be etched is etched using the mask.

16 Claims, 6 Drawing Sheets

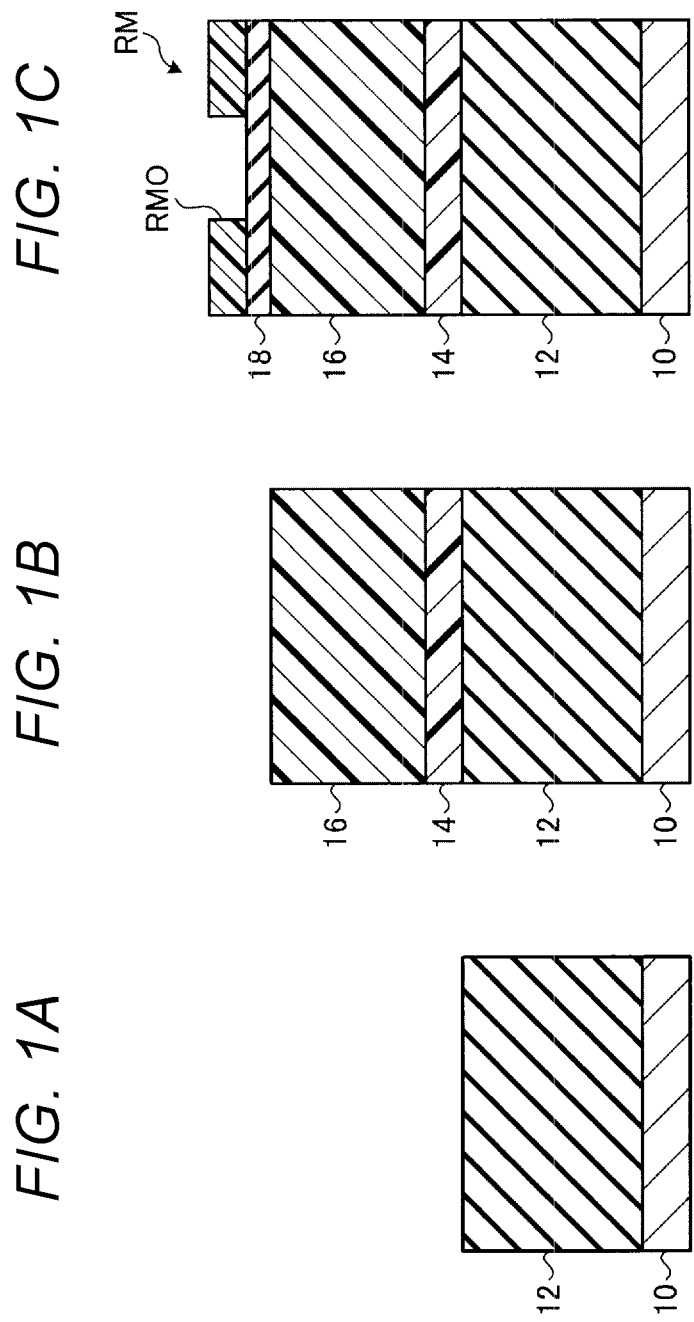

PATTERN FORMATION METHOD AND SEMICONDUCTOR DEVICE MANUFACTURING METHOD

CROSS-REFERENCE TO RELATED APPLICATIONS

This application is based upon and claims the benefit of priority from Japanese Patent Application No. 2020-036677, filed Mar. 4, 2020, the entire contents of which are incorporated herein by reference.

FIELD

Embodiments described herein relate generally to a pattern formation method and a semiconductor device manufacturing method.

BACKGROUND

Some semiconductor devices have a three-dimensional structure in which elements are stacked longitudinally. At a time of manufacturing such a device, holes are formed for the three-dimensional structure. An aspect ratio of the holes tends to grow. To form a hole having a high aspect ratio, etching time is prolonged. Owing to this, a side wall of the hole is exposed to active species such as ions and radicals. This often causes an inner wall of a recess portion such as a hole to be depressed.

DESCRIPTION OF THE DRAWINGS

FIGS. 1A to 1C schematically show cross-sections of layers formed in each process of a pattern formation method according to a first embodiment.

DETAILED DESCRIPTION

Figure 2A:
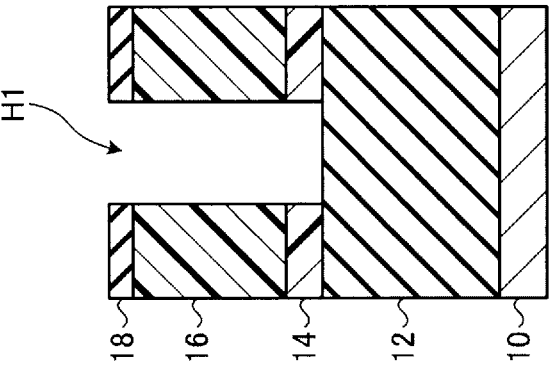
FIGS. 2A to 2C schematically show cross-sections of layers formed in each process of the pattern formation method according to the first embodiment, subsequently to FIG. 1C.
Figure 2B:
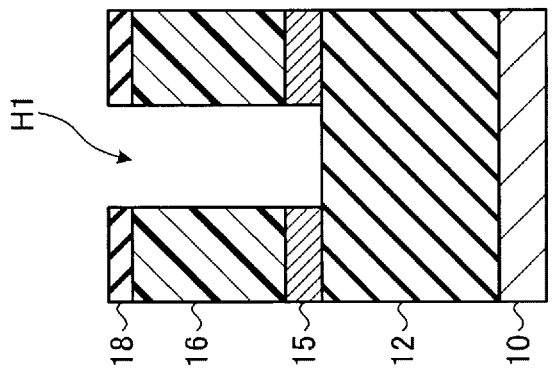

At least one embodiment provides a pattern formation method and a semiconductor device manufacturing method capable of reducing depression in an inner wall of a recess portion at a time of etching a film to form the recess portion.

In general, according to at least one embodiment, a pattern formation method includes: forming a first organic film on a film to be etched; and forming a second organic film on the first organic film, the second organic film having a higher density than a density of the first organic film. Furthermore, the pattern formation method includes: patterning the second organic film and the first organic film to form a mask having an opening for forming a recess portion in the film to be etched; and causing a metal to be infiltrated into the first organic film from an inner side surface of the first organic film exposed at a side wall of the opening of the mask. Moreover, the pattern formation methods includes forming the recess portion in the film to be etched using this mask.

Non-exclusive embodiments will be described hereinafter with reference to the accompanying drawings. In the entire accompanying drawings, same or corresponding members or components are denoted by same or corresponding reference signs and repetitive description is omitted. Furthermore, the accompanying drawings are not intended to illustrate relative ratios of various film or layer thicknesses and specific thicknesses and dimensions may be determined as appropriate in light of the following non-exclusive embodiments.

First Embodiment

A pattern formation method according to a first embodiment will be described with reference to FIGS. 1A to 3B. These drawings schematically show cross-sections of various layers formed in each process of the pattern formation method.

With reference to FIG. 1A, an insulating film 12 is formed on a base layer 10. The base layer 10 may be formed from an insulating material different from that of the insulating film 12. Furthermore, the base layer 10 may be formed from silicon and may be a silicon wafer, for example. Integrated circuits, interconnections, and the like may be formed on the silicon wafer.

The insulating film 12 is a film to be etched and a hole is formed in the insulating film 12 in at least one embodiment as described later. Furthermore, the insulating film 12 may be formed from silicon oxide (SiOx) or silicon oxynitride (SiON). Alternately, the insulating film 12 may be a stacked film in which SiOx layers and silicon nitride (SiN) layers are alternately formed, a stacked film in which SiOx layers and silicon (Si) layers are alternately formed, or a stacked film in which SiOx layers and metal layers are alternately formed.

As shown in FIG. 1B, an organic film 14 is formed on the insulating film 12 and a CVD carbon film 16 is formed on the organic film 14. The organic film 14 is desirably formed from an organic material containing reactive groups such as a carbonyl group and a carboxy group having, for example, a double bond between a carbon atom and an oxygen atom. Examples of such an organic material include polymethyl methacrylate (PMMA), polyxylomethylmethacrylate (PXMA), and polyacetonyl methacrylate (PAcMA). In a case of using any of these organic materials, the organic film 14 may be formed by, for example, spin coating. It is noted that the organic film 14 has desirably a density lower than, for example, 1.3 $g/cm^3$ and a concentration of the reactive groups contained in the organic film 14 is desirably equal to or higher than 5%.

The CVD carbon film 16 formed on the organic film 14 is a film mainly containing carbon and hydrogen and may be deposited by, for example, a chemical vapor deposition (CVD) method using a hydrocarbon gas as a raw material. It is also desirable that the CVD carbon film 16 has a density higher than that of the organic film 14. In at least one embodiment, the density of the CVD carbon film 16 is, for example, equal to or higher than 1.3 $g/cm^3$. On the other hand, the organic film 14 contains more reactive groups than the CVD carbon film 16. The CVD carbon film 16 contains hardly any of the reactive groups and the concentration of the reactive groups, even if contained, is, for example, only lower than 5%.

Next, as shown in FIG. 1C, an antireflection film 18 is formed on the CVD carbon film 16 and a resist mask RM is formed on the antireflection film 18. The antireflection film 18 is formed from, for example, SiON. The resist mask RM is formed by exposing a resist film (not shown) coated on the antireflection film 18 to light through a predetermined mask. An opening RMO is formed in the resist mask RM, and this opening RMO has an opening dimension corresponding to an opening to be formed later in the insulating film 12.

Next, using the resist mask RM as a mask, the antireflection film 18 is etched by reactive ion etching (RIE). A pattern of the resist mask RM is thereby transferred onto the antireflection film 18. Subsequently, as shown in FIG. 2A, the CVD carbon film 16 and the organic film 14 are patterned by RIE using the antireflection film 18 as a mask. Since the CVD carbon film 16 and the organic film 14 are films mainly containing carbon, the CVD carbon film 16 and the organic film 14 can be patterned collectively without changing etching gases. Furthermore, it is preferable to use, as an etching gas, a gas containing oxygen ($O_2$), carbon monoxide (CO), carbon dioxide ($CO_2$), nitrogen (N), hydrogen (H), methane ($CH_4$), carbonyl sulfide (COS), or sulfur dioxide ($SO_2$). By patterning the CVD carbon film 16 and the organic film 14 in this way, a hole H1 is formed in the CVD carbon film 16 and the organic film 14. It is noted that the resist mask RM used as the mask is removed at the time of patterning the CVD carbon film 16 and the organic film 14.

A metal impregnation treatment is then performed on the organic film 14. Specifically, in a vacuum chamber, which is not shown, the base layer 10, the insulating film 12, the organic film 14, and the CVD carbon film 16 are kept in a temperature range from approximately 80° C. to approximately 300° C. (for example, kept at 200° C.), and a trimethyl aluminum (TMA) gas is introduced into the vacuum chamber. An inner side surface of the organic film 14 exposed to a side wall of the hole H1 is thereby exposed to the TMA gas and the TMA gas is impregnated into the organic film 14 from the inner side surface.

As described above, the organic film 14 may be formed from the organic material having the double bond between a carbon atom and an oxygen atom such as PMMA, PXMA, and PAcMA. The TMA gas is prone to be captured by the double bond between the carbon atom and the oxygen atom and is, therefore, prone to be impregnated into the organic film 14. On the other hand, the TMA gas is hardly impregnated into the CVD carbon film 16 while an inner side surface of the CVD carbon film 16 is also exposed to the side wall of the hole H1 and exposed to the TMA gas. This is because the CVD carbon film 16 has hardly any reactive groups such as carbonyl groups.

After passage of predetermined time, the TMA gas is purged and an oxidation gas such as a water vapor ($H_2O$), an oxygen ($O_2$) gas, or an ozone ($O_3$) gas is introduced into the vacuum chamber. The TMA impregnated into the organic film 14 is oxidized by this oxidation gas and produces a chemical bond with the organic material. A metal-containing organic film 15 containing aluminum is thereby obtained.

Next, the insulating film 12 is etched by RIE. As an etching gas, a mixture gas of octafluorocyclobutane ($C_4F_8$), oxygen ($O_2$), and argon (Ar) may be used. While this etching is conducted using the CVD carbon film 16 and the metal-containing organic film 15 as a mask, the CVD carbon film 16 having a high density and a high etch resistance functions as a substantial mask.

Figure 2C:
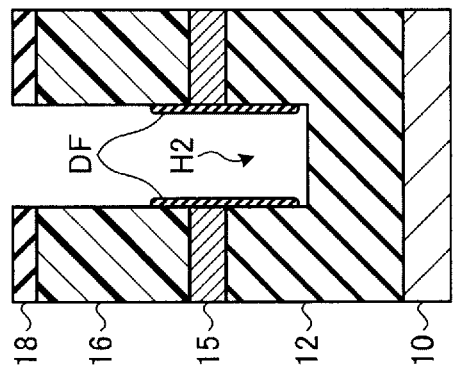

While the insulating film 12 is being etched, an inner side surface of the metal-containing organic film 15 is also exposed to the etching gas. Owing to this, active species such as ions and radicals in the etching gas cause a reaction of aluminum oxide impregnated into the metal-containing organic film 15 with active fluorine species (radicals, ions) or the like to produce aluminum fluoride (AlF). AlF adheres to an inner side surface of a hole H2 formed in the insulating film 12 by sputtering or the like and to the inner side surface of the CVD carbon film 16. Since AlF is low in vapor pressure and difficult to etch by RIE, AlF is easily deposited as a deposited film DF (FIG. 2C).

It is noted herein that the deposited film DF deposited on the inner side surface of the hole H2 in the insulating film 12 exhibits a resistance against the RIE. The deposited film DF can, therefore, function as a protective film. That is, the deposited film DF prevents side etching of the inner side surface of the hole H2 (etching of the inner side surface of the hole H2 in a transverse direction in FIG. 2C). Furthermore, AlF is also deposited on a newly formed inner side surface as the etching of the insulating film 12 progresses and the hole H2 becomes deeper. That is, the deposited film DF extends downward in proportion to the progress of etching. Owing to this, the etching of the insulating film 12 progresses while the inner side surface of the hole H2 is prevented from being depressed. The etching is then ended when the base layer 10 is exposed to a bottom surface of the hole H2.

Figure 3A:
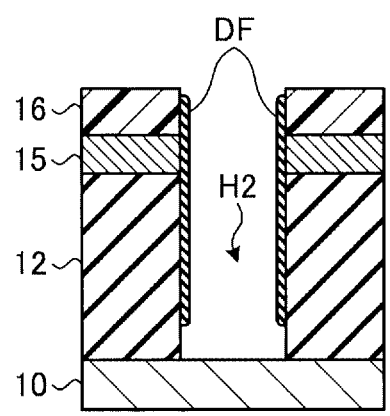
FIGS. 3A and 3B schematically show cross-sections of layers formed in each process of the pattern formation method according to the first embodiment, subsequently to FIG. 2C.
Figure 3B:
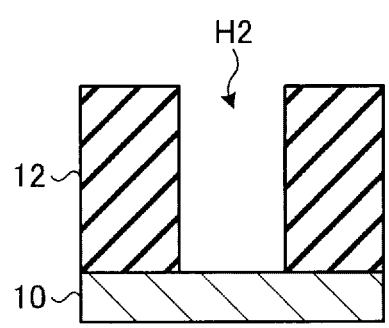

Subsequently, the metal-containing organic film 15 and the CVD carbon film 16 remaining on the insulating film 12 are removed by asking or wet etching. At this time, the deposited film DF remaining on the inner side surface of the hole H2 in the insulating film 12 is also removed. Through these processes, the hole H2 is formed in the insulating film 12 as shown in FIG. 3B.

As described so far, with the pattern formation method according to at least one embodiment, when the insulating film 12 to be etched is etched and the hole H2 is formed, Al atoms in the metal-containing organic film 15 formed on the insulating film 12 combine with active fluorine species in the etching gas to produce AlF. This AlF is ejected by sputtering or the like and the deposited film DF formed from AlF is deposited on the inner side surface of the hole H2. Since the deposited film DF exhibits etch resistance, the deposited film DF can prevent the side etching of the hole H2. It is, therefore, possible to form the hole H2 in the insulating film 12 with an opening dimension thereof made constant and without depression of the inner side surface of the hole H2.

(Comparison)

Figure 4A:
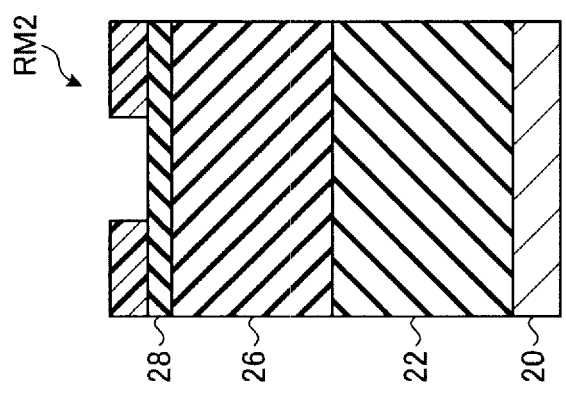
FIGS. 4A to 4C are explanatory diagrams of a pattern formation method according to a comparison.
Figure 4B:
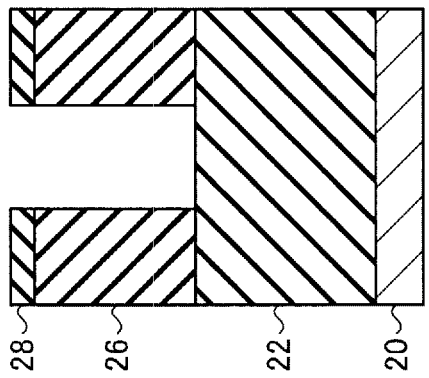
Figure 4C:
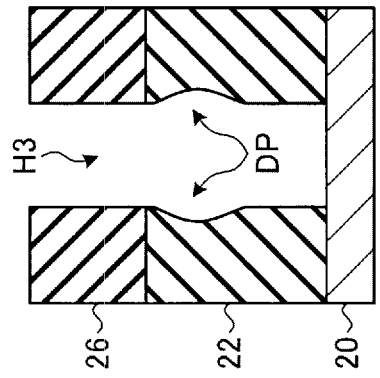

As a comparison, a case of, for example, not using the metal-containing organic film 15 will be described with reference to FIGS. 4A to 4C. That is, an insulating film 22 as a film to be etched is formed on a base layer 20 as shown in FIG. 4A, and a CVD carbon film 26 is then directly formed on the insulating film 22. Next, this CVD carbon film 26 is patterned by an antireflection film 28 formed on the CVD carbon film 26 and a resist mask RM2 (FIG. 4B). The insulating film 22 is then etched using the patterned CVD carbon film 26 as a mask. Since an inner side surface of a hole H3 formed in the insulating film 22 by this etching is also exposed to an etching gas, the inner side surface of the hole H3 is depressed and a depressed portion DP is generated as shown in FIG. 4C. Generation of the depressed portion DP on the inner side surface in this way would lead to, for example, occurrence of a characteristic fluctuation of elements formed within the hole H3. However, the pattern formation method according to at least one embodiment can prevent the inner side surface of the hole from being depressed and make characteristics of elements uniform.

In a case of preventing the depression of the inner side surface of the hole formed in the insulating film as illustrated in the comparison, it is conceivable to interrupt etching, form a protective film exhibiting an etch resistance on the inner side surface of the hole by, for example, a CVD method, and then resume etching. With such a method, however, it takes much time to form the hole. Furthermore, when the protective film is etched, it is necessary to deposit the protective film again and it disadvantageously takes longer time.

With the pattern formation method according to at least one embodiment, by contrast, Al atoms as a raw material for the protective film are provided from the metal-containing organic film 15 provided on the film to be etched (insulating film 12) and AlF produced by combination of Al atoms with active fluorine species in the etching gas is deposited on the inner side surface of the hole H2 as the protective film DF during etching of the film to be etched (insulating film 12). That is, the protective film DF is deposited during etching and it is unnecessary to deposit separately.

Moreover, as shown in FIG. 4C, the depressed portion DP tends to be generated near an upper opening on the inner side surface of the hole H3. With the pattern formation method according to at least one embodiment, the metal-containing organic film 15 is formed on the insulating film 12 to be etched and Al as the raw material for the protective film is, therefore, supplied from a location near an upper opening of the hole H2. This can facilitate forming the deposited film DF in a portion prone to be depressed and preventing the generation of the depressed portion.

Furthermore, with the pattern formation method according to at least one embodiment, it is possible to adjust a thickness of the deposited film DF deposited on the inner side surface of the insulating film 12 (thickness in a direction perpendicular to the inner side surface) and a deposition range (length in a direction parallel to the inner side surface) during etching, depending on a thickness of the metal-containing organic film 15 and a concentration of Al atoms contained in the metal-containing organic film 15 by the metal impregnation treatment. Thus, it is desirable to appropriately suppress the inner side surface of the hole H2 from being depressed by adjusting the thickness of the metal-containing organic film 15 and a metal content to prevent depletion of AlF released into a vapor phase during etching. A thickness of the organic film 14 (metal-containing organic film 15) may be, for example, equal to or smaller than 500 nm. However, the thickness of the organic film 14 is determined through, for example, a preparatory experiment or the like in consideration of a depth of the hole H2 and etching time.

Moreover, with the pattern formation method according to at least one embodiment, the mask used to etch the insulating film 12 has a two-layer structure of the metal-containing organic film 15 and the CVD carbon film 16 on the metal-containing organic film 15. Since the upper CVD carbon film 16 is higher in density than the metal-containing organic film 15, the CVD carbon film 16 can substantially function as an etching mask. Since the high density film can be used as the etching mask, dimensional accuracy after etching is improved. Furthermore, using such an etching mask is beneficial in that an etching selectivity of the etching mask to the film can be set high.

As described above, the thickness of the organic film 14 (metal-containing organic film 15) is desirably determined in consideration of the thickness of the deposited film DF and the deposition range, and the thickness of the CVD carbon film 16 is desirably determined to prevent the CVD carbon film 16 from getting dissipated during etching of the insulating film 12. It is preferable, for example, that a ratio of a thickness t1 of the organic film 14 to a thickness t2 of the CVD carbon film 16 is t1:t2=1:3.

Second Embodiment

A semiconductor device manufacturing method according to a second embodiment will next be described with reference to FIGS. 5A to 6D. FIGS. 5A to 6D schematically show cross-sections of various layers formed in each process of the semiconductor device manufacturing method according to the second embodiment.

Figure 5A:
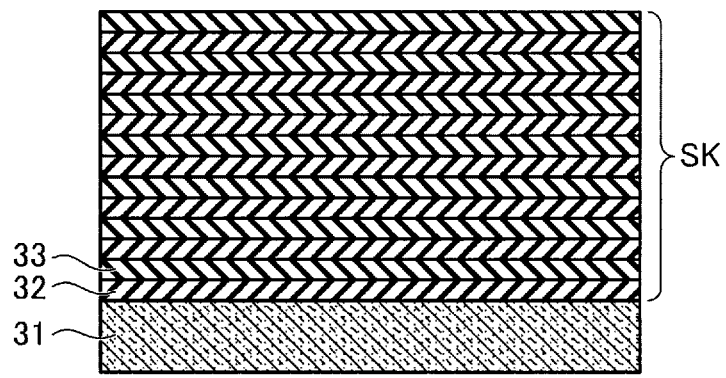
FIGS. 5A to 5C schematically show cross-sections of layers formed in each process of a semiconductor device manufacturing method according to a second embodiment.

In FIG. 5A, a base layer 31 is formed on a semiconductor substrate (not shown) which is, for example, a silicon wafer. It is noted that the base layer 31 may be the semiconductor substrate itself; in which case, the base layer 31 may have integrated circuits, interconnections, and the like. Alternatively, the base layer 31 may be an insulating film.

A stacked body SK is formed on the base layer 31. The stacked body SK has insulating films 32 and 33 alternately formed by, for example, a CVD method and may be different in material. For example, the insulating film 32 may be a SiOx film and the insulating film 33 may be a SiN film. A thickness of the insulating film 32 as the SiOx film may be, for example, 50 nm, and a thickness of the insulating film 33 as the SiN film may be, for example, 30 nm. In addition, each of the numbers of insulating films 32 and 33 can be set to, for example, 50. In this case, a thickness of the stacked body SK is approximately 4 µm.

Figure 5B:
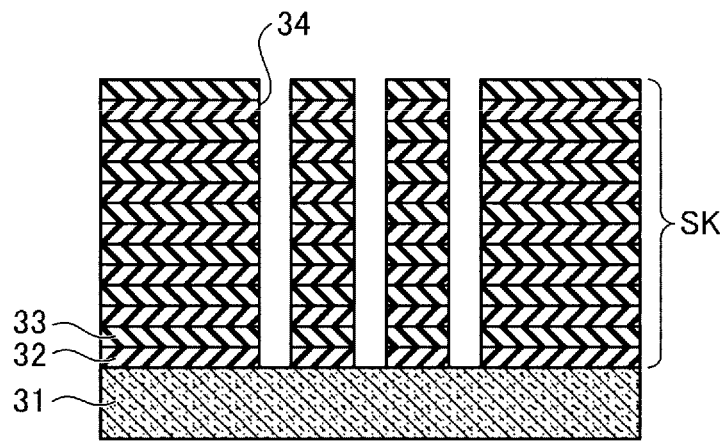

Next, as shown in FIG. 5B, memory holes 34 are formed in the stacked body SK. A diameter of each memory hole 34 can be set to, for example, several tens of nm. The memory holes 34 are formed by the pattern formation method according to the first embodiment. That is, the organic film 14 and the CVD carbon film 16 (FIG. 1B) are sequentially formed first on the stacked body SK as a film to be etched. Next, the antireflection film 18 is formed on the CVD carbon film 16, and the resist mask RM (FIG. 1C) having the opening RMO corresponding to an opening diameter of each memory hole 34 is formed on the antireflection film 18. By using the resist mask RM, the organic film 14 and the CVD carbon film 16 are patterned (FIG. 2A), and the hole H1 (FIG. 2A) corresponding to the opening diameter of each memory hole 34 is formed in these films 14 and 16.

Subsequently, the TMA gas is impregnated into the organic film 14 from the inner side surface of the organic film 14 exposed to the hole H1, the TMA gas is oxidized by the oxidation gas, and the metal-containing organic film 15 (FIG. 2B) is obtained. When the stacked body SK is etched by RIE using a fluorine-containing etching gas with the CVD carbon film 16 and the metal-containing organic film 15 used as a mask, the memory holes 34 are formed. During this etching, aluminum in the metal-containing organic film 15 reacts with active fluorine species to produce AlF and this AlF is deposited on inner side surfaces of the memory holes 34 that are being formed. That is, the deposited film DF protects the inner side surfaces of the memory holes 34 from being etched and, therefore, prevents the inner side surfaces of the memory holes 34 from being depressed. The memory holes 34 can, therefore, have a uniform opening dimension along a depth direction.

Figure 5C:
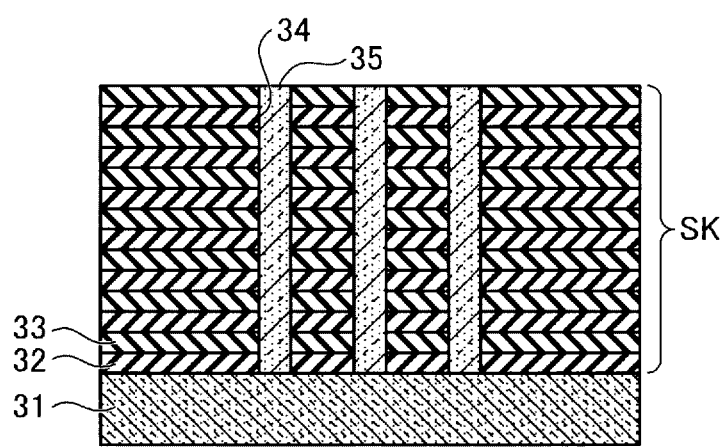

Next, as shown in FIG. 5C, each memory hole 34 is buried with a columnar body 35 by, for example, the CVD method. A configuration of the columnar body 35 will be described later.

Figure 6A:
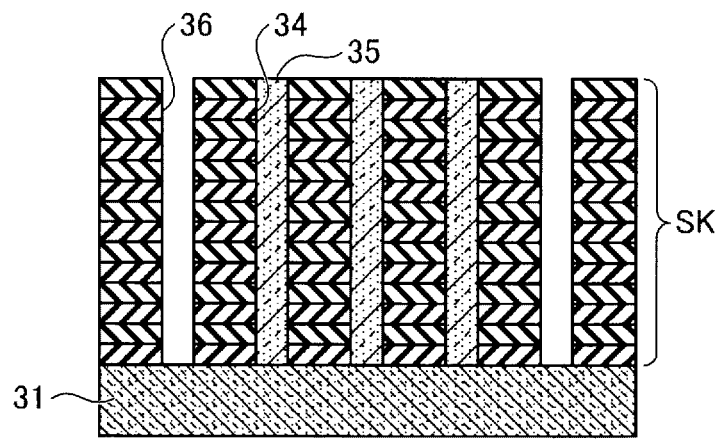
FIGS. 6A to 6D schematically show cross-sections of layers formed in each process of the semiconductor device manufacturing method according to the second embodiment, subsequently to FIG. 5C.

Next, as shown in FIG. 6A, slits 36 are formed in the stacked body SK. The pattern formation method according to the first embodiment is also applied to formation of the slits 36. Therefore, it is possible to form the slits 36 without depressing inner side surfaces thereof.

Figure 6B:
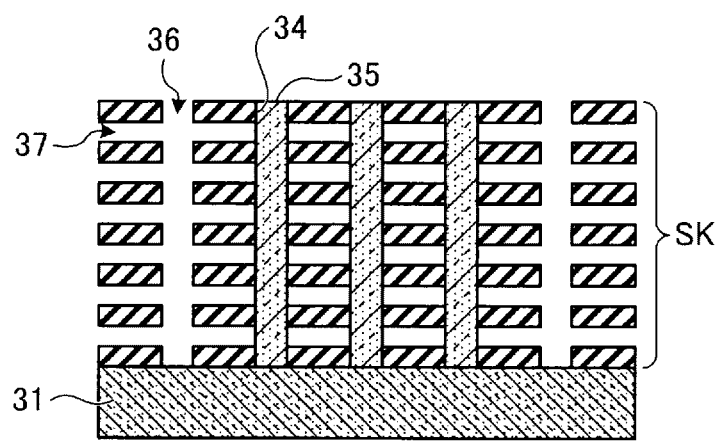

Next, as shown in FIG. 6B, the insulating films 33 are selectively etched by such a method as wet etching, thereby forming cavities 37 between the insulating films 32.

Figure 6C:
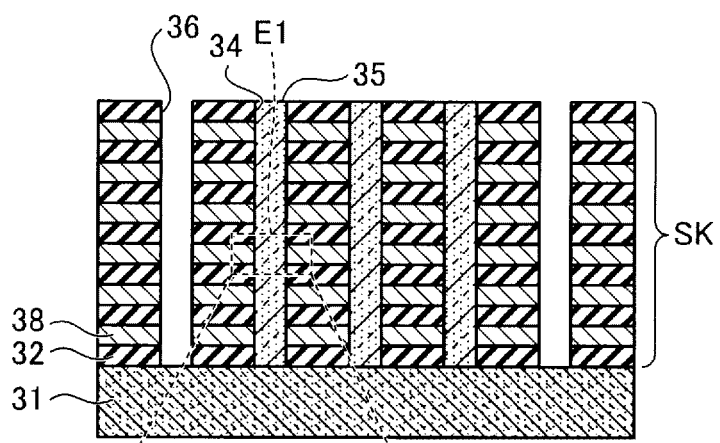

Subsequently, as shown in FIG. 6C, a conductive film 38 is buried in each cavity 37 by a method such as CVD. As a material for the conductive film 38, tungsten or polycrystalline silicon, for example, may be used.

Figure 6D:
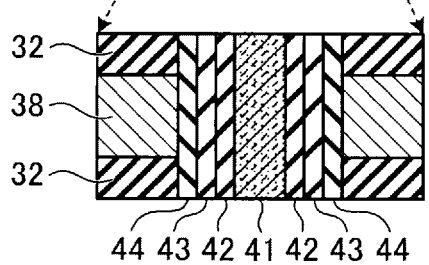

As shown in FIG. 6D, the columnar body 35 has a columnar semiconductor 41, a tunnel insulating film 42, a charge trap layer 43, and a block insulating film 44. The columnar body 35 can be formed by depositing the block insulating film 44, the charge trap layer 43, the tunnel insulating film 42, and the columnar semiconductor 41 in this order by, for example, a CVD method or an atomic layer deposition (ALD) method.

The columnar semiconductor 41 has a solid and generally columnar shape. The tunnel insulating film 42, the charge trap layer 43, and the block insulating film 44 each have a generally cylindrical shape, and are disposed concentrically about the columnar semiconductor 41. That is, the tunnel insulating film 42 surrounds an outer periphery of the columnar semiconductor 41, the charge trap layer 43 surrounds an outer periphery of the tunnel insulating film 42, and the block insulating film 44 surrounds an outer periphery of the charge trap layer 43. The columnar semiconductor 41 is formed from, for example, a semiconductor such as Si. The tunnel insulating film 42 and the block insulating film 44 may be formed from, for example, SiO. The charge trap layer 43 may be formed from, for example, SiN. Alternatively, the charge trap layer 43 may be an ONO film (three layers of SiO film/SiN film/SiO film). The charge trap layer 43 can function as a memory film that stores data. Such a columnar body 35 can be used as memory cells in a NAND flash memory. Furthermore, uppermost and lowermost conductive films 38 out of the conductive films 38 can be used as select gate lines in the NAND flash memory. The conductive films 38 between the uppermost and the lowermost conductive films 38 can be used as word lines in the NAND flash memory.

With the semiconductor device manufacturing method according to at least one embodiment described so far, a memory device as an example of a semiconductor device can be manufactured. In the semiconductor device manufacturing method according to at least one embodiment, the memory holes 34 and the slits 36 are formed by the pattern formation method according to the first embodiment. Owing to this, the semiconductor device manufacturing method according to at least one embodiment can also exhibit advantages of the pattern formation method according to the first embodiment.

While certain embodiments have been described, these embodiments have been presented by way of example only, and are not intended to limit the scope of the disclosure.

For example, while the case of forming the organic film 14 from PMMA, PXMA, or the like is illustrated by an example, the present disclosure is not limited to the case and the organic film 14 may be formed from an organic material that can contain a metal. For example, the organic film 14 may be formed from an organic material containing reactive groups such as sulfonyl groups having a double bond between a sulfur atom and an oxygen atom. Even in this case, the organic film 14 contains more reactive groups than the carbon-containing material film (CVD carbon film 16 in at least one embodiment described above) formed on the organic film 14. Furthermore, the density of such an organic film 14 is lower than that of the carbon-containing material film.

While the organic film 14 is exposed to the TMA gas and the TMA gas is impregnated into the organic film 14 in the embodiments described above, an organometallic gas containing a metallic element other than aluminum may be used as an alternative to the TMA gas. Examples of such a metallic element include chromium (Cr), hafnium (Hf), indium (In), manganese (Mn), molybdenum (Mo), ruthenium (Ru), tantalum (Ta), titanium (Ti), vanadium (V), tungsten (W), and zirconium (Zr). Moreover, two of or three or more of these metallic elements may be combined according to various embodiments.

Furthermore, the organic metal is not limited to the organic metal containing methyl groups and an organic metal containing ethyl groups or an organic metal containing other organic groups may be used. Examples of such an organic metal include bis(cyclopentadienyl) chromium (Cr $(C_2H_5)_2$), cyclopentadienylmanganese tricarbonyl ($(C_5H_5)$ $Mn(CO)_3$), TDMAT, tetrakis(ethylmethylamino) titanium (TEMAT), tetra-tert-butoxytitanium titanium (Ti$(OtBu)_4$), tetrakis(ethylmethylamino)zirconium (TEMAZ), tetra(dimethylamino)zirconium (TDMAZ), zirconium tert-butoxide (Zr$(OtBu)_4$), tetrakis(dimethylamino)hafnium (TDMAH), tetrakis(ethylmethylamino)hafnium (TEMAH), tetrakis(diethylamino)hafnium (TDEAH), and hafnium tetra-t-butoxide Hf$(OtBu)_4$). Furthermore, a halide gas such as $AlCl_3$, $MoF_6$, $WF_6$, $TiCl_4$, $ZrCl_4$, and $HfCl_4$ may be used in the metal impregnation treatment.

Moreover, while the TMA gas is impregnated into the organic film 14 and an oxidation treatment for oxidizing the TMA gas is then performed in at least one embodiment described above, the oxidation treatment may be freely performed. However, the oxidation treatment, when performed, can ensure fixing Al atoms in the organic film 14.

Furthermore, while the holes are formed in the film to be etched in the second embodiment, the semiconductor device manufacturing method according to at least one embodiment is also applicable to a case of forming various recess portions including a line and space structure in the film to be etched.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A pattern formation method comprising:
    forming a first organic film on a film to be etched;
    forming a second organic film on the first organic film, the second organic film having a higher density than a density of the first organic film;

patterning the second organic film and the first organic film to form a mask having an opening with a sidewall, the first organic film having an inner side surface exposed at the sidewall;

causing a metal to be infiltrated into the first organic film from the inner side surface by exposing gas containing metal atoms to the inner side surface of the first organic film; and forming a recess portion in the film to be etched using the mask;

wherein the first organic film is formed from an organic material containing reactive groups having a double bond between a carbon or sulfur atom, and an oxygen atom.

2. The pattern formation method according to claim 1, wherein
the first organic film contains more reactive groups than the second organic film.

3. The pattern formation method according to claim 1, wherein
the metal is at least one of aluminum (Al), chromium (Cr), hafnium (Hf), indium (In), manganese (Mn), molybdenum (Mo), ruthenium (Ru), tantalum (Ta), titanium (Ti), vanadium (V), tungsten (W), or zirconium (Zr).

4. The pattern formation method according to claim 1, wherein
the inner side surface of the first organic film is exposed to oxidation gas after exposing the inner side surface to the gas containing metal atoms.

5. The pattern formation method according to claim 1, wherein
the recess portion is formed using fluorine-containing gas.

6. The pattern formation method according to claim 1, wherein
the second organic film is formed on the first organic film by a chemical vapor deposition method.

7. The pattern formation method according to claim 1, wherein the patterning the second organic film and the first organic film is performed using the same etch gas.

8. The pattern formation method according to claim 1, wherein the patterning the second organic film and the first organic film is performed by reactive ion etching.

9. The pattern formation method according to claim 1, wherein the density of the first organic film is less than 1.3 g/m$^3$.

10. The pattern formation method according to claim 1, wherein the density of the second organic film is greater than or equal to 1.3 g/m$^3$.

11. The pattern formation method according to claim 1, wherein the first organic film is formed by spin coating.

12. The pattern formation method according to claim 1, further comprising forming an anti-reflective coating on the second organic film.

13. The pattern formation method according to claim 12, further comprising forming a resist mask on the second organic film.

14. A semiconductor device manufacturing method, comprising:
forming a film to be etched on a semiconductor substrate;
forming a first organic film on the film to be etched;
forming a second organic film on the first organic film, the second organic film having a higher density than a density of the first organic film;
patterning the second organic film and the first organic film to form a mask having an opening with a sidewall, the first organic film having an inner side surface exposed at the sidewall;
causing a metal to be infiltrated into the first organic film from the inner side surface by exposing gas containing metal atoms to the inner side surface of the first organic film; and
etching the film to be etched using the mask, thereby forming a recess portion in the film to be etched;
wherein the first organic film is formed from an organic material containing reactive groups having a double bond between a carbon or sulfur atom, and an oxygen atom.

15. The semiconductor device manufacturing method according to claim 14, wherein
the film to be etched is a film having silicon oxide layers and silicon nitride layers alternately stacked.

16. A pattern formation method comprising:
forming a first organic film on a film to be etched;
forming a second organic film on the first organic film, the second organic film having a higher density than a density of the first organic film;
patterning the second organic film and the first organic film to form a mask having an opening with a sidewall, the first organic film having an inner side surface exposed at the sidewall;
causing a metal to be infiltrated into the first organic film from the inner side surface by exposing gas containing metal atoms to the inner side surface of the first organic film; and
forming a recess portion in the film to be etched using the mask;
wherein the inner side surface of the first organic film is exposed to oxidation gas after exposing the inner side surface to the gas containing metal atoms.

* * * * *